(12) United States Patent
Chen et al.

(10) Patent No.: US 8,138,785 B2
(45) Date of Patent: *Mar. 20, 2012

(54) REDUCED POWER OUTPUT BUFFER

(75) Inventors: Jie Chen, Saratoga, CA (US); Ting-Yen Chiang, Palo Alto, CA (US); Kuang-Yu Chen, Saratoga, CA (US); Chen Yu Wang, San Jose, CA (US); Joe Froniewski, Palo Alto, CA (US)

(73) Assignee: Silego Technology, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/586,288

(22) Filed: Sep. 18, 2009

(65) Prior Publication Data

US 2010/0148817 A1 Jun. 17, 2010

Related U.S. Application Data

(63) Continuation of application No. 12/070,374, filed on Feb. 15, 2008, now Pat. No. 7,612,580, which is a continuation of application No. 11/069,921, filed on Feb. 28, 2005, now Pat. No. 7,358,772.

(51) Int. Cl.
*H03K 19/0175* (2006.01)

(52) U.S. Cl. .......................................... 326/30; 326/27

(58) Field of Classification Search .................... 326/26, 326/27, 30, 82–87
See application file for complete search history.

(56) References Cited

U.S. PATENT DOCUMENTS

| | | | |
|---|---|---|---|
| 6,198,307 B1 * | 3/2001 | Garlepp et al. ................. 326/83 |
| 6,570,415 B2 * | 5/2003 | Chen et al. ..................... 327/108 |
| 6,897,699 B1 * | 5/2005 | Nguyen et al. ................. 327/295 |

* cited by examiner

*Primary Examiner* — Don Le
(74) *Attorney, Agent, or Firm* — Van Pelt, Yi & James LLP

(57) ABSTRACT

A clock driving circuit and a method of driving a plurality of output lines for a PC architecture are disclosed. The clock driving circuit includes a clock generating circuit coupled to an output buffer for the PC having a plurality of output lines connected to a plurality of output loads having output load impedances. The output lines are driven differentially at an output voltage lower than a supply voltage. The circuit includes a voltage node having a voltage node impedance. The voltage node is maintained at substantially the output voltage. The circuit includes a current sinking transistor that sinks current from the voltage node. The current sinking transistor is operated in a linear region characterized by an ohmic resistance determined by the size of the current sinking transistor. The impedance of the voltage node is matched to one of the load impedances by sizing the current sinking transistor.

36 Claims, 5 Drawing Sheets

REDUCED POWER OUTPUT BUFFER

CROSS REFERENCE TO OTHER APPLICATIONS

This application is a continuation of U.S. patent application Ser. No. 12/070,374 entitled REDUCED POWER OUTPUT BUFFER, filed Feb. 15, 2008 now U.S. Pat. No. 7,612,580, which is incorporated herein by reference for all purposes, which is a continuation of U.S. patent application Ser. No. 11/069,921 entitled REDUCED POWER OUTPUT BUFFER, filed Feb. 28, 2005, now U.S. Pat. No. 7,358,772, which is incorporated herein by reference for all purposes.

FIELD OF THE INVENTION

The present invention relates generally to circuit design. More specifically, an output buffer is disclosed.

BACKGROUND OF THE INVENTION

Output buffers are used to set a voltage on an output line to drive a load. A PC clock generator circuit may be coupled to an output buffer that provides a lower voltage than the supply voltage. For example, the PCI Express Special Interest Group has recently specified a 700 mV differential clock from a supply voltage of approximately 2.5V to 3.3V. FIG. 1 is a circuit diagram illustrating a typical output buffer. Circuit 100 is shown to include input voltage 102, NMOS transistor 104, current source 106, resistor 110, resistor 112, load 114, and output voltage 116. Input voltage 102 is connected to the gate of transistor 104. The source of transistor 104 is connected to the low rail. Current source 106 is connected between the high rail and the drain of transistor 104. Resistor 110 is connected between the drain of transistor 104 and output voltage 116. Resistor 112 is connected between output voltage 116 and the low rail. Output voltage 116 is provided to load 114. Output voltage 116 swings between 0 and 0.7V. Current source 106 supplies 14 mA of current. Resistor 110 has a 33Ω resistance. Resistor 112 has a 50Ω resistance to match the 50Ω impedance of load 114. When output voltage 116 is high, 14 mA is drawn through resistor 112, which dissipates power. It would be desirable to develop a design that would reduce power consumption and still provide good impedance matching.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A buffer sets an output voltage on an output line connected to a load. The output node is maintained at substantially the output voltage. The output node is considered to be at substantially the output voltage when it is close enough for a system connected to the buffer to operate normally. A current sinking transistor is operated in the linear region. The impedance of the output node is matched to the load impedance by sizing the current sinking transistor and/or a resistor.

Figure 1:
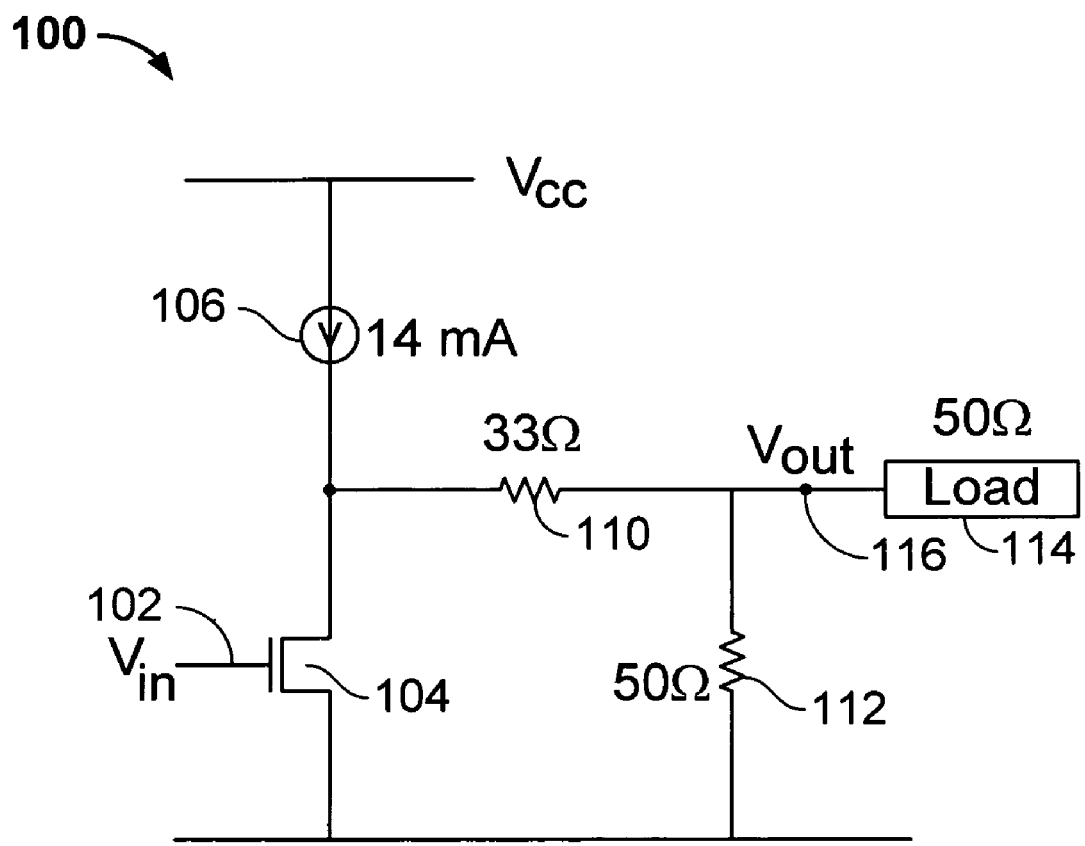
FIG. 1 is a circuit diagram illustrating a typical output buffer.
Figure 2:
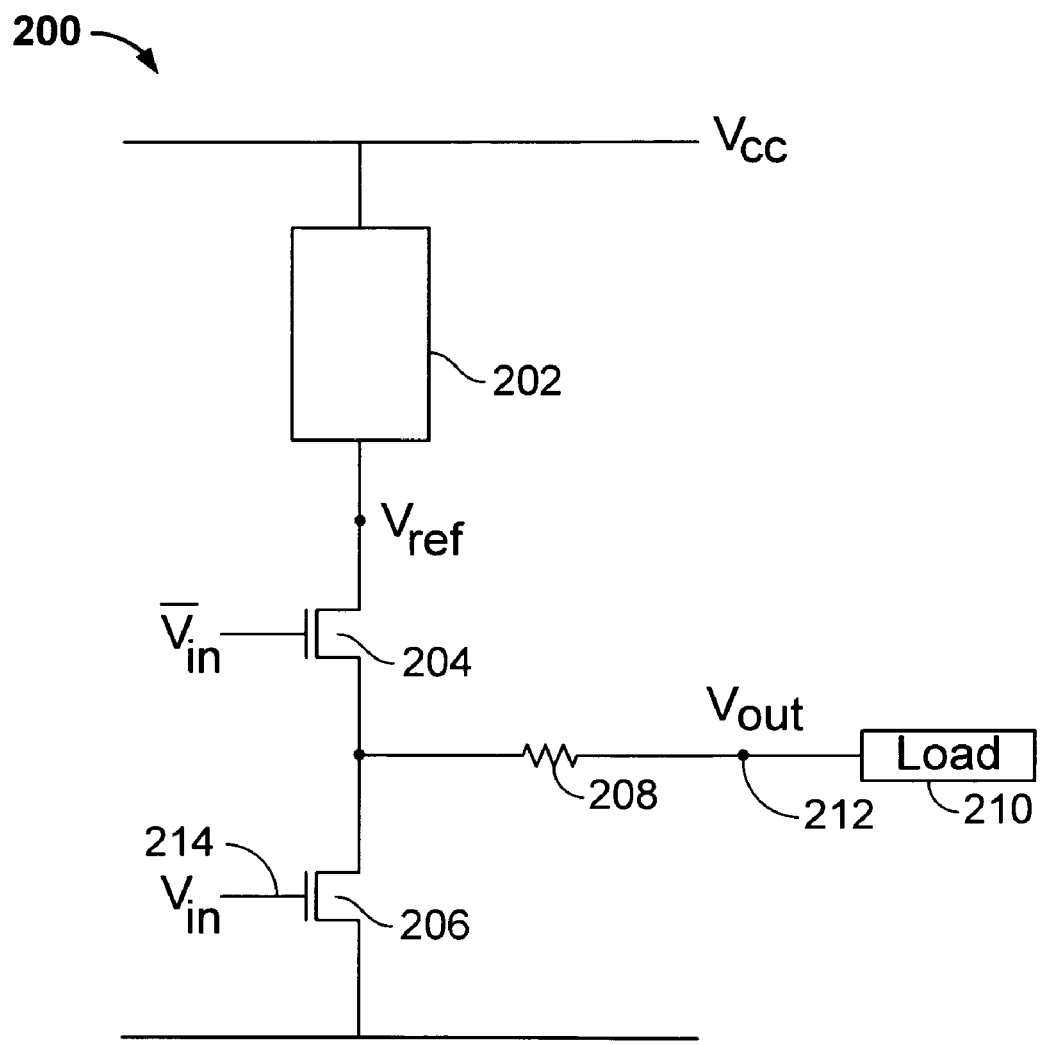
FIG. 2 is a circuit diagram illustrating an output buffer.

FIG. 2 is a circuit diagram illustrating an output buffer 200. In the example shown, output buffer 200 is shown to include voltage regulator 202, NMOS transistor 204, NMOS transistor 206, resistor 208, load 210, input voltage 214, and output voltage 212.

Input voltage 214 is applied to the gate of transistor 206. The source of transistor 206 is connected to the low rail. The drain of transistor 206 is connected to the source of transistor 204. The complement of input voltage 214 is applied to the gate of transistor 204. Voltage regulator 202 is connected between the high rail and the drain of transistor 204. Resistor 208 connects the source of transistor 204 and the drain of transistor 206 with output voltage 212. Output voltage 212 is provided to load 210. In this example, the load impedance is 50Ω. Output voltage 212 swings between 0 and 0.7V. The high rail is 3.3V and the low rail is 0V.

Transistor 204 is a current sourcing transistor that supplies current to output node 212 when input voltage 214 is low. Transistor 206 is a current sinking transistor that sinks current from output voltage 212 when input voltage 214 is high. The impedance of output node 212 is matched to the load impedance, as more fully described below.

In this example, voltage regulator 202 internally generates an internal reference voltage ($V_{ref}$) of 0.7V. Voltage regulator 202 could generate any internal reference voltage that enables transistor 204 to operate in the linear region. Various circuits can be used for voltage regulation. For example, a voltage divider or a voltage regulator as described in Analysis and Design of Analog Integrated Circuits by Paul Gray and Robert Meyer could be used. As a result, transistors 204 and 206 operate in a linear region characterized by an ohmic resistance. The drain current $I_D$ is approximately linear with respect to the drain to source voltage $V_{DS}$. An ohmic resistance is one characterized by Ohm's Law. The resistance value is configured by the size of the transistor and the gate to source voltage of the transistor ($V_{GS}$). The output impedance of buffer 200 can be matched to the load impedance by configuring the sizes of the transistors, $V_{GS}$, and/or the resistance of resistor 208. For example, if the load impedance is 50Ω, each transistor could be configured to have a resistance of 17Ω and resistor 208 can be selected to have a resistance of 33Ω. The output impedance would be 50Ω and would sufficiently match the 50Ω load impedance. In this way, any load impedance can be matched.

By regulating the drain of transistor 204 at 0.7V, the output voltage can be charged to 0.7V. In some embodiments, transistor 204 acts like a source follower, which means that the source follows the gate voltage. However, since the drain is only at 0.7V, the output will rise to 0.7V. The impedance of a source follower is low. The transistor can be sized to match the load impedance of 50Ω.

Circuit 200 provides a reduced power output buffer. There is no need to sink any output current through an external resistor that matches the impedance of the load, since the circuit can be configured to provide an impedance match with the load.

Figure 3A:
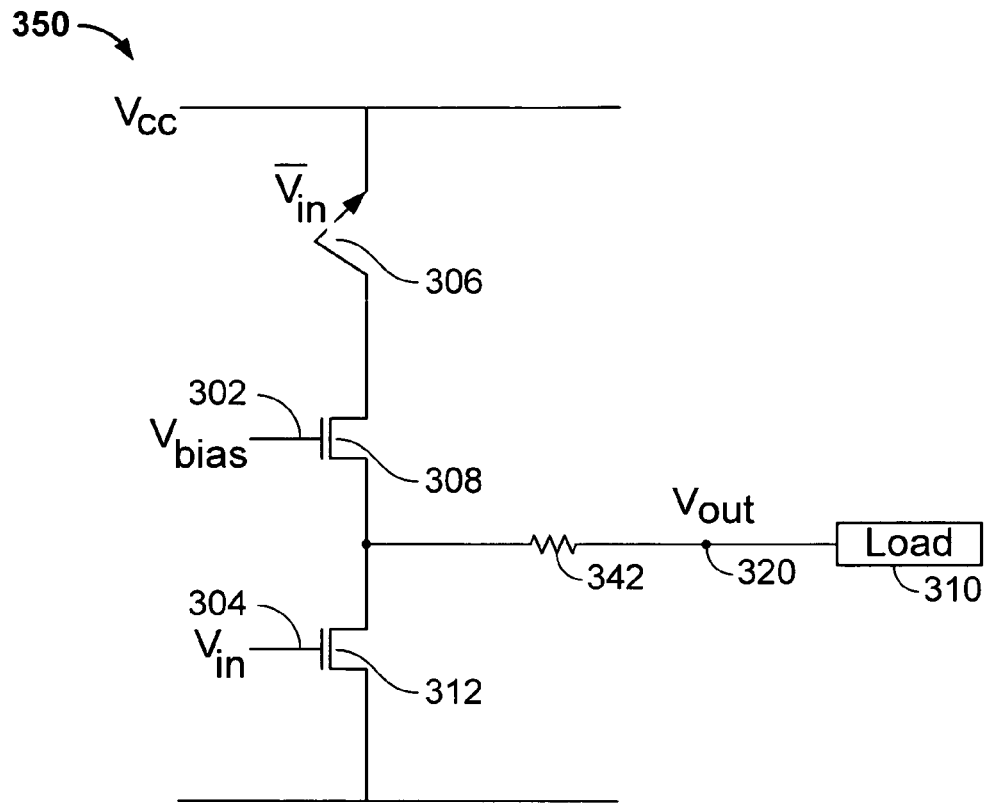
FIG. 3A is a circuit diagram illustrating an output buffer.

FIG. 3A is a circuit diagram illustrating an output buffer 350. In the example shown, output buffer 350 is shown to include bias voltage 302, input voltage 304, switch 306, NMOS transistor 308, NMOS transistor 312, resistor 342, output voltage 320, and load 310. Input voltage 304 is applied to the gate of transistor 312. The source of transistor 312 is connected to the low rail. The drain of transistor 312 is connected to resistor 342 and the source of transistor 308. Bias voltage 302 is applied to the gate of transistor 308. Switch 306 connects the drain of transistor 308 with the high rail. Switch 306 is controlled by input voltage 304, which may be done in various ways. In this example, when input voltage 304 is high, the switch is open. When input voltage 304 is low, the switch is closed. Resistor 342 connects the source of transistor 312 with output voltage 320. Output voltage 320 is provided to load 310. In this example, output voltage 320 swings between 0 and 0.7V. The high rail is 3.3V and the low rail is 0V.

In this example, a bias voltage ($V_{bias}$) of 1.6V is applied to the gate of transistor 308. When input voltage 304 is low, switch 306 is closed and a current flows through the drain of transistor 308. The source of transistor 308 rises to $V_{bias}$−$V_{TN}$. (If the source of transistor 308 rises above $V_{bias}$−$V_{TN}$, transistor 308 turns off.) For example, if $V_{bias}$ is 1.6V and $V_{TN}$ is 0.7V, then $V_{bias}$−$V_{TN}$ is 0.9V.

Switch 306 could be implemented in any appropriate way. For example, switch 306 could comprise an NMOS or a PMOS transistor configured as a switch. When switch 306 is closed, the gate of transistor 302 (which is biased at 1.6V) is higher than output voltage 320+$V_{TN}$. Transistor 308 acts like source follower. Source followers can provide low impedance. In some embodiments, transistor 308 operates in the saturation region. Transistors 308 and 312 can be sized to match the output impedance. In some embodiments, bias voltage 302 is selected in the range from 1.4V to 1.6V.

The resistance of transistor 312 is configured by the size of the transistor and the gate to source voltage of the transistor ($V_{GS}$). The output impedance of buffer 350 can be matched to the load impedance by configuring the size of transistor 312, $V_{GS}$, and/or the impedance of resistor 342. For example, if the impedance of load 310 is 50Ω, transistor 312 could be configured to have a resistance of 17Ω and resistor 342 can be selected to have a resistance of 33Ω. The impedance of output 320 would be 50Ω and would match the 50Ω impedance of load 310. In this way, any load impedance could be matched.

If the resistance of resistor 342 is 0, the impedance of transistor 312 can be adjusted to be close to 50Ω to match the output impedance.

Figure 3B:
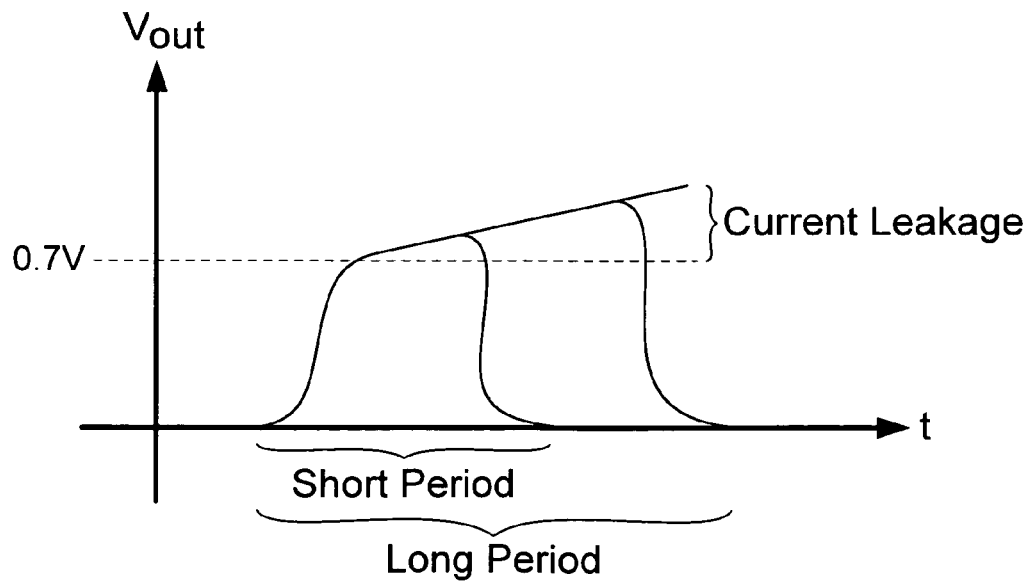
FIG. 3B is a plot illustrating an output voltage versus time.

FIG. 3B is a plot illustrating output voltage 320 versus time. When input voltage 304 transitions from high to low, switch 306 closes and output voltage 320 rises to $V_H$ (e.g., 0.7V). However, tail current from transistor 308 can cause output voltage 320 to drift with time, as shown. If the period of the signal is long, the voltage drift can be significant. In some embodiments, a bleeder network or other mechanism is used to offset the leakage current. For example, a small current sink can be connected from output node 320 to the low rail.

Figure 3C:
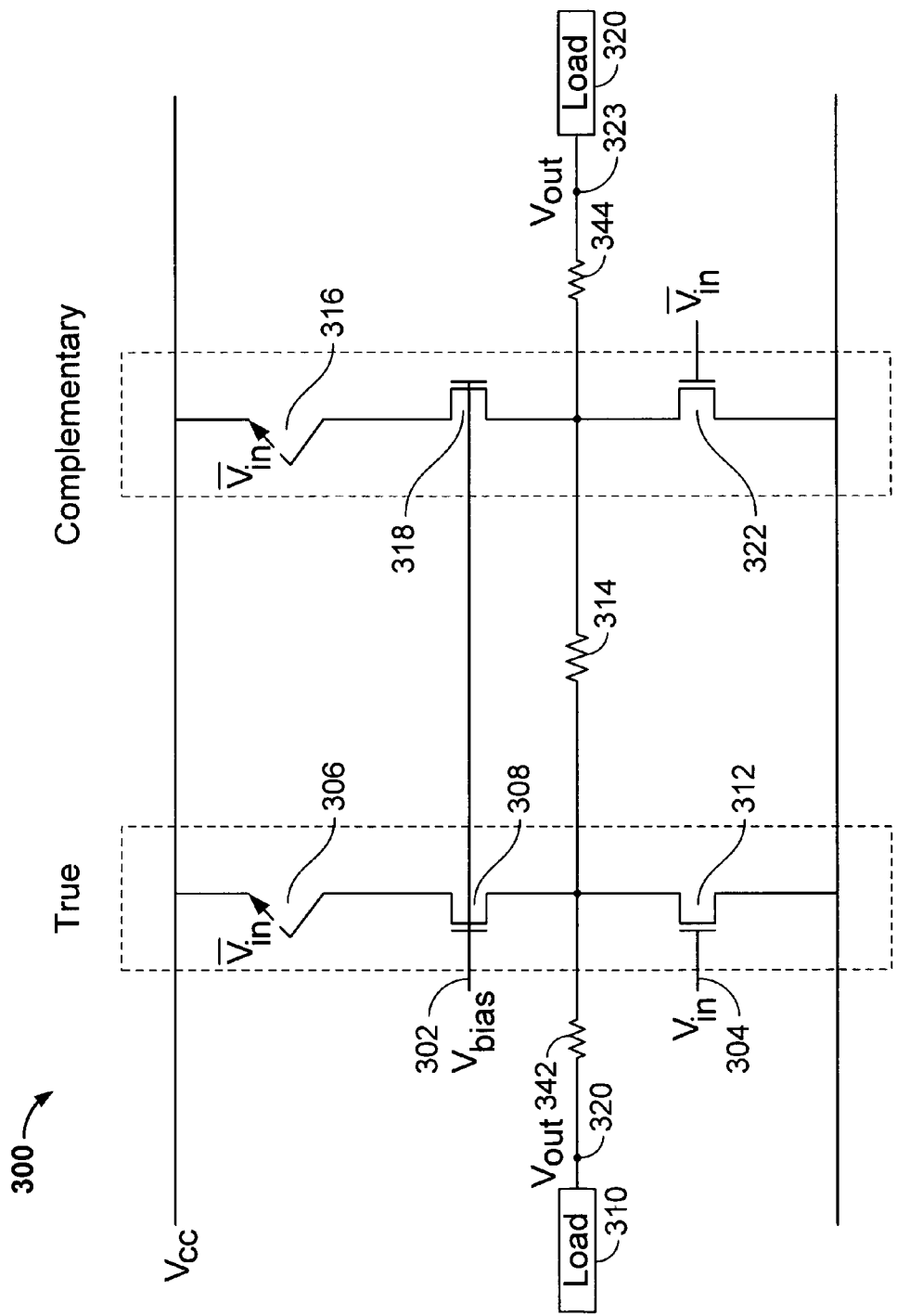
FIG. 3C is a circuit diagram illustrating an output buffer.

FIG. 3C is a circuit diagram illustrating an output buffer 300. In the example shown, output buffer 300 is shown to include bias voltage 302, input voltage 304, switch 306, NMOS transistor 308, load 310, NMOS transistor 312, resistor 314, switch 316, NMOS transistor 318, NMOS transistor 322, resistor 342, resistor 344, output voltage 320, output voltage 323, and load 320.

Input voltage 304 is applied to the gate of transistor 312. The source of transistor 312 is connected to the low rail. The drain of transistor 312 is connected to the resistor 342, resistor 314, and the source of transistor 308. Internal bias voltage 302 is applied to the gate of transistor 308. Various circuits can be used to provide the bias voltage. For example, a voltage divider or a Bandgap reference as described in Analysis and Design of Analog Integrated Circuits by Paul Gray and Robert Meyer could be used. Switch 306 connects the drain of transistor 308 with the high rail. Switch 306 is controlled by input voltage 304, which may be done in various ways. In this example, when input voltage 304 is high, the switch is open. When input voltage 304 is low, the switch is closed. Resistor 342 connects output voltage 320 with the drain of transistor 312. Output voltage 320 is provided to load 310. In this example, output voltage 320 swings between 0 and 0.7V. The high rail is 3.3V and the low rail is 0V.

The complement of input voltage 304 is applied to the gate of transistor 322. The source of transistor 322 is connected to the low rail. The drain of transistor 322 is connected to resistor 344, resistor 314, and the source of transistor 318. Bias voltage 302 is applied to the gate of transistor 318. Switch 316 connects the high rail with the drain of transistor 318. Switch 316 is controlled by input voltage 304, which may be done in various ways. In this example, when input voltage 304 is high, the switch is closed. When input voltage 304 is low, the switch is open. Resistor 344 connects output voltage 323 with the drain of transistor 322. Output voltage 323 is provided to load 320. The output swing of output voltage 320 and output voltage 323 is 0 to 0.7V in some embodiments.

Resistor 314 connects the drain of transistor 312 with the drain of transistor 322. In some embodiments, resistor 314 has relatively high impedance. For example, resistor 314 could be a 2 kΩ-10 kΩ resistor. Resistor 314 serves as a conduit for leakage current, as more fully described below. In some embodiments, circuit 300 is a complementary pair with true and complementary inputs and outputs. When output voltage 320 is high, output voltage 323 is low, and vice versa. In some embodiments, output voltage 320 and output voltage 323 drive two independent lines in a buffer.

Transistor 308 is a current sourcing transistor that supplies current to output node 320 when input voltage 304 is low. Transistor 312 is a current sinking transistor that sinks current from output node 320 when input voltage 304 is high. The impedance of output node 320 is matched to the impedance of load 310. The impedance of output node 323 is matched to the impedance of load 320, as more fully described below.

Switch 306 and switch 316 could be implemented in any appropriate way. For example, each switch could comprise an NMOS or a PMOS transistor configured as a switch. When switch 306 is closed, the gate of transistor 302 (which is biased at 1.6V) is higher than output voltage 320+$V_{TN}$. Transistor 308 acts like source follower. Source followers can provide a low impedance. The transistor can be sized to match the output impedance. In some embodiments, bias voltage 302 is selected in the range from 1.4V to 1.6V.

The resistance of transistor 312 is configured by the size of the transistor and the gate to source voltage of the transistor ($V_{GS}$). The output impedance of buffer 300 can be matched to the load impedance by configuring the size of transistor 312, $V_{GS}$, and/or the resistance of resistor 342. For example, if the impedance of load 310 is 50Ω, transistor 312 could be configured to have a resistance of 17Ω and resistor 342 can be selected to have a resistance of 33Ω. The impedance of output 320 would be 50Ω which would match the 50Ω impedance of load 310. The load impedance can be similarly matched on the complementary side of the circuit. In some embodiments, resistor 342 and resistor 344 each have a resistance of 33Ω and output load 310 and output load 320 each have a resistance of 50Ω. In this way, any load impedance could be matched.

When input voltage 304 is low, switch 306 is closed and a current flows through the drain of transistor 308. The source of transistor 308 rises to $V_{bias}-V_{TN}$. If the source of transistor 308 rises above $V_{bias}-V_{TN}$, transistor 308 turns off. For example, if $V_{bias}$ is 1.6V and $V_{TN}$ is 0.7V, then $V_{bias}-V_{TN}$ is 0.9V.

In some embodiments, circuit 300 is a complementary pair with true and complementary inputs and outputs. For example, switch 306 and transistors 308 and 312 could comprise the true side of the complementary pair and switch 316 and transistors 318 and 322 could comprise the complementary side. When input voltage 304 is high, output voltage 320 is low and output voltage 323 is high. In this state, transistor 312 pulls down output voltage 320. Transistor 322 is turned off, and output voltage 323 is pulled high. Tail current from transistor 318 is bled through resistor 314 and transistor 312 to the low rail. As such, transistor 312 serves both to hold output 320 low and to bleed leakage current from transistor 318.

A similar description can be made of transistor 322 when input voltage 304 is low. When input voltage 304 is low, output voltage 320 is high and output voltage 323 is low. In this state, transistor 322 pulls down output voltage 320. Transistor 322 serves both to hold output 323 low and as a current source for the pull up source follower, transistor 308. Transistor 322 (in conjunction with resistor 314) can be considered a bleeder network in that it sinks leakage current from output node 320 when output node 320 is high. As such, circuit 300 self-bleeds leakage current from its output voltage nodes, and no additional current source is needed for the pull up source followers (transistors 308 and 318). Resistor 314 acts as a conduit for bleeder current to either side of the circuit. In some embodiments, resistor 314 is replaced by a PMOS or NMOS transistor (e.g., a long channel transistor) with an equivalent resistance. Any resistor described above may be replaced by a device with an equivalent resistance in other embodiments.

Circuit 300 provides a reduced power output buffer. There is no need to sink any output current through an external resistor that matches the impedance of the load, since the circuit can be configured to provide an impedance match with the load. No internal current source is required. $V_{bias}$ is applied to the gate of transistors 308 and 318, but the gate does not draw current to consume power.

In some embodiments, these buffers may be adapted for use with other types of transistors. For example, the circuits could be reconfigured as appropriate for use with PMOS transistors.

In some embodiments, multiple lines are driven by multiple output buffers. When many lines switch at once, ground bounce (or $V_{cc}$ bounce) can occur. In some embodiments, the number of ground pins is increased to reduce ground bounce. In some embodiments, the lines are driven out of phase from each other to reduce ground bounce.

Figure 4:
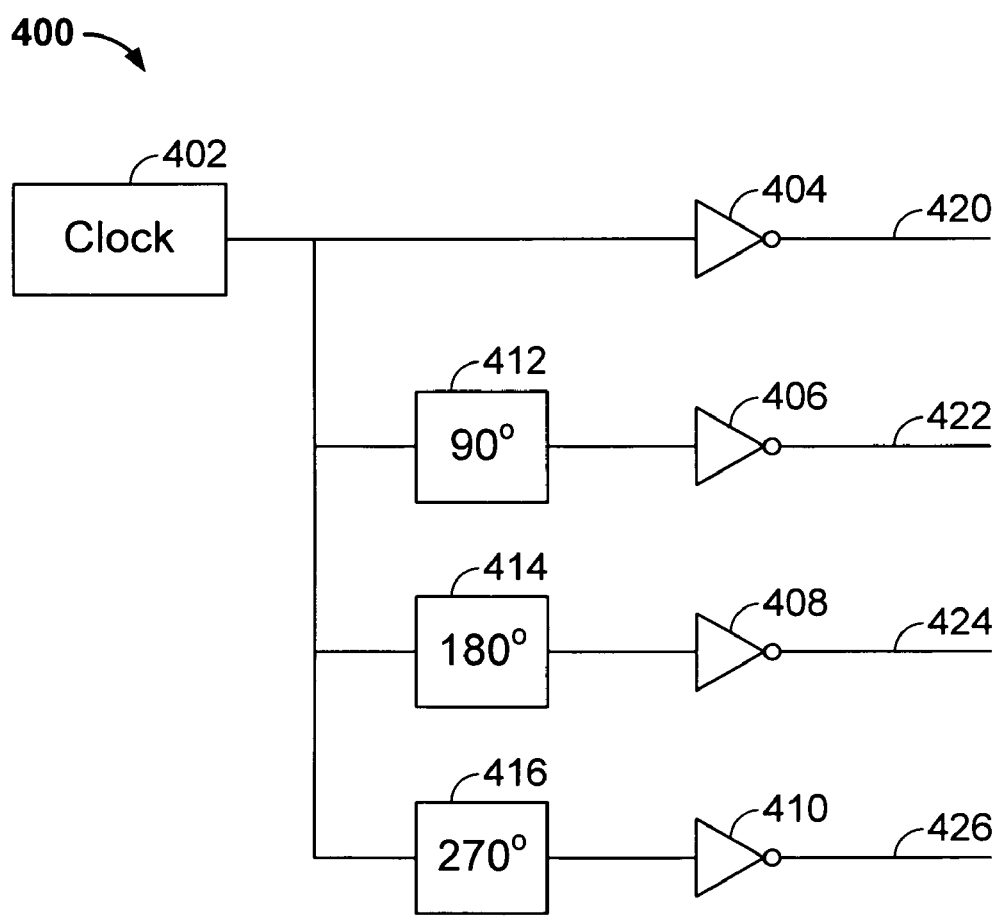
FIG. 4 is a circuit diagram illustrating a clock generator driving a plurality of output lines.

FIG. 4 is a circuit diagram illustrating a clock generator driving a plurality of output lines. In this example, clock generator 402 is connected to the input of output buffer 404 and delay blocks 412, 414, and 416. The output of delay block 412 is provided to the input of buffer 406. The output of delay block 414 is provided to the input of buffer 408. The output of delay block 416 is provided to the input of buffer 410. Each buffer 404, 406, 408, and 410 could be any one of buffer circuits 200, 300, or 350. In this example, delay block 412 delays the clock by 90 degrees, delay block 414 delays the clock by 180 degrees, and delay block 416 delays the clock by 270 degrees. The delays can be introduced using analog or digital circuitry. By driving the inputs to output buffers 404-410 out of phase, outputs 420, 422, 424, and 426 will not all go to ground at once. As such, ground bounce in the outputs of output buffer 404-410 can be significantly reduced. Any number of delay blocks may be included in other embodiments. Each delay block can be configured to have any appropriate phase delay. In some embodiments, in addition to driving one or more lines out of phase, the number of ground pins is increased to reduce ground bounce.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An output buffer circuit, comprising:
   an output line connected to an output load having an output load impedance, wherein the output line is driven differentially at an output voltage lower than a supply voltage;
   a voltage node having a voltage node impedance, wherein the voltage node is maintained at substantially the output voltage;
   a current sourcing transistor that supplies current to the voltage node; and
   a current sinking transistor that sinks current from the voltage node, wherein the current sinking transistor is operated in a linear region and is characterized by an ohmic resistance;
   wherein the voltage node impedance is matched to the output load impedance at least in part via the ohmic resistance of the current sinking transistor.

2. An output buffer circuit as recited in claim 1, wherein the current sourcing transistor supplies current to the voltage node when the output voltage is high.

3. An output buffer circuit as recited in claim 1, wherein the current sinking transistor sinks current from the voltage node when the output voltage is low.

4. An output buffer circuit as recited in claim 1, wherein the current sourcing transistor is operated in a linear region.

5. An output buffer circuit as recited in claim 1, wherein the linear region is characterized by an approximately linear relationship between the drain to source voltage ($V_{DS}$) of the current sinking transistor and the drain current ($I_D$) of the current sinking transistor.

6. An output buffer circuit as recited in claim 1, wherein the ohmic resistance of the current sinking transistor is determined by one or both of a size of the current sinking transistor and a gate to source voltage ($V_{GS}$) of the current sinking transistor.

7. An output buffer circuit as recited in claim 1, wherein the current sourcing transistor is characterized by an ohmic resistance determined by one or both of a size of the current sourcing transistor and a gate to source voltage ($V_{GS}$) of the current sourcing transistor.

8. An output buffer circuit as recited in claim 1, wherein the voltage node impedance is matched to the output load impedance at least in part via an ohmic resistance of the current sourcing transistor.

9. An output buffer circuit as recited in claim 1, wherein the voltage node impedance is matched to the output load impedance at least in part via a resistor.

10. An output buffer circuit as recited in claim 1, wherein the current sourcing transistor comprises a source follower.

11. An output buffer circuit as recited in claim 1, wherein a drain of the current sourcing transistor is maintained at a reference voltage.

12. An output buffer circuit as recited in claim 1, wherein a drain of the current sourcing transistor is connected to a voltage regulator.

13. An output buffer circuit as recited in claim 1, wherein a drain of the current sourcing transistor is connected to a voltage divider.

14. An output buffer circuit as recited in claim 1, wherein a gate of the current sourcing transistor is maintained at a bias voltage.

15. An output buffer circuit as recited in claim 1, wherein a gate of the current sourcing transistor is connected to a voltage regulator.

16. An output buffer circuit as recited in claim 1, wherein a gate of the current sourcing transistor is connected to a voltage reference circuit.

17. An output buffer circuit as recited in claim 1, wherein the current sourcing transistor is connected to a switch and wherein the switch is connected to a voltage source.

18. An output buffer circuit as recited in claim 1, wherein the current sourcing transistor is connected to a transistor that is configured as a switch to a voltage source.

19. An output buffer circuit as recited in claim 1, wherein the current sourcing transistor is operated in a saturation region.

20. An output buffer circuit as recited in claim 1, wherein the current sourcing transistor supplies current to the voltage node when the current sourcing transistor is turned on and further comprising a bleeder network for sinking leakage current from the current sourcing transistor.

21. An output buffer circuit as recited in claim 1, further comprising a bleeder network for sinking leakage current.

22. An output buffer circuit as recited in claim 1, further comprising a bleeder network for sinking leakage current, wherein the bleeder network is connected in parallel with the current sinking transistor.

23. An output buffer circuit as recited in claim 1, further comprising a bleeder network for sinking leakage current, wherein the bleeder network comprises a resistor.

24. An output buffer circuit as recited in claim 1, further comprising a second current sinking transistor that sinks current from a second voltage node, wherein the second current sinking transistor is operated in a linear region characterized by an ohmic resistance.

25. An output buffer circuit as recited in claim 1, further comprising a second current sinking transistor that sinks current from a second voltage node.

26. An output buffer circuit as recited in claim 1, further comprising a second current sinking transistor that sinks leakage current from the current sourcing transistor.

27. An output buffer circuit as recited in claim 1, further comprising a second current sourcing transistor that supplies current to a second voltage node maintained at a voltage that is complementary to the output voltage.

28. An output buffer circuit as recited in claim 1, further comprising a second current sinking transistor that sinks current from a second voltage node maintained at a voltage that is complementary to the output voltage, wherein the second current sinking transistor sinks current from the second voltage node and acts as a current source to the current sourcing transistor when the second voltage node is low.

29. An output buffer circuit as recited in claim 1, further comprising a second current sinking transistor that sinks leakage current from the current sourcing transistor, wherein a resistor is connected between the drains of the current sinking transistors.

30. An output buffer circuit as recited in claim 1, further comprising a resistor that sinks leakage current from the current sourcing transistor.

31. An output buffer circuit as recited in claim 1, wherein the current sinking transistor comprises an NMOS transistor.

32. An output buffer circuit as recited in claim 1, wherein the output line is driven differentially at approximately 1V or less.

33. An output buffer circuit as recited in claim 1, wherein the output buffer circuit comprises a plurality of buffers that drive a plurality of output lines connected to a plurality of output loads.

34. An output buffer circuit as recited in claim 1, further comprising more than one ground pin.

35. An output buffer circuit as recited in claim 1, wherein the output buffer circuit comprises a first and a second buffer, wherein the first buffer is driven by a first clock input and the second buffer is driven by a second clock input that is out of phase with the first clock input.

36. A method for configuring an output buffer circuit, comprising:
    driving an output line differentially at an output voltage lower than a supply voltage, wherein the output line is connected to an output load having an output load impedance;
    maintaining a voltage node at substantially the output voltage, wherein the voltage node has a voltage node impedance;
    configuring a current sourcing transistor to supply current to the voltage node; and
    configuring a current sinking transistor to sink current from the voltage node, wherein the current sinking transistor is operated in a linear region and is characterized by an ohmic resistance;
    wherein the voltage node impedance is matched to the output load impedance at least in part via the ohmic resistance of the current sinking transistor.

* * * * *